United States Patent
Sakaki

(10) Patent No.: US 6,482,300 B2
(45) Date of Patent: Nov. 19, 2002

(54) CUP SHAPED PLATING APPARATUS WITH A DISC SHAPED STIRRING DEVICE HAVING AN OPENING IN THE CENTER THEREOF

(75) Inventor: Yasuhiko Sakaki, Hiratsuka (JP)

(73) Assignee: Electroplating Engineers of Japan Limited, Tokyo (JP)

( * ) Notice: Subject to any disclaimer, the term of this patent is extended or adjusted under 35 U.S.C. 154(b) by 18 days.

(21) Appl. No.: 09/779,526

(22) Filed: Feb. 9, 2001

(65) Prior Publication Data

US 2002/0108850 A1 Aug. 15, 2002

(51) Int. Cl.[7] .............................. C25B 9/00; C25C 7/00; C25D 17/00
(52) U.S. Cl. ............... 204/273; 204/224 R; 204/DIG. 7
(58) Field of Search ................. 205/96, 133, 148, 205/123, 125; 204/273, 224 R, DIG. 7, 222

(56) References Cited

U.S. PATENT DOCUMENTS 5,683,564 A * 11/1997 Reynolds ................. 204/212
6,001,235 A * 12/1999 Arken et al. ............. 204/212
6,080,288 A *  6/2000 Schwartz et al. ...... 204/224 R
6,251,250 B1 *  6/2001 Keigler ................... 204/224 R

* cited by examiner

Primary Examiner—Nam Nguyen
Assistant Examiner—Wesley A. Nicolas
(74) Attorney, Agent, or Firm—Arent Fox Kintner Plotkin & Kahn

(57) ABSTRACT

This invention provides a technique capable of solving a problem of an ununiform plating on an annular edge portion of a surface to be plated of a wafer, which ununiform plating is usually caused due to an ununiform flow of a plating apparatus, thereby ensuring a uniform plating treatment on the entire surface to be plated of a wafer. The present invention is directed to a cup-shaped plating apparatus comprising a wafer support section provided along an upper opening of a plating tank, a plurality of solution-outlet passages provided below the wafer support section and extending from the inside of and to the outside of the plating tank and at least one solution-supply pipe provided through the bottom of the plating tank.

4 Claims, 2 Drawing Sheets

CUP SHAPED PLATING APPARATUS WITH A DISC SHAPED STIRRING DEVICE HAVING AN OPENING IN THE CENTER THEREOF

BACKGROUND OF THE INVENTION

1. Technical Field of the Invention

The present invention relates to a cup-type plating apparatus for carrying out a plating treatment on a semiconductor wafer.

2. Description of the Related Art

Conventionally, there has been known and in practical use a cup-type plating apparatus for carrying out a plating treatment on a semiconductor wafer. Such a cup-type plating apparatus comprises a wafer support section provided along an upper opening of a plating tank, a plurality of plating-solution-outlet passages provided below the wafer support section and extending from the inside of the plating tank to the outside thereof, at least one plating-solution-supply pipe provided through the bottom of the plating tank. In detail, a plating solution supplied to the plating tank through the at least one plating-solution-supply pipe by virtue of an upward flow of the plating solution, is caused to form a plurality of outward flows passing through the plurality of plating-solution-outlet passages and thus arriving at the outside of the plating tank, while at the same time the plating solution is caused to contact a surface to be plated (the surface to be plated) of a wafer mounted on the wafer support section, to whereby effect a plating treatment on the wafer.

In fact, such a cup-type plating apparatus is so formed that the plating liquid can be supplied, by virtue of an upward flow of the plating solution, to the surface to be plated of the wafer. As a result, the plating solution is caused to contact the surface to be plated of the wafer, in a manner such that the plating solution flows radially from an area near the center of the surface to be plated towards its annular edge portion, thereby effecting a uniform plating treatment on the entire wafer surface to be plated. Then, since the plating treatment can be performed on a great number of wafers by successively replacing one treated wafer (mounted on the wafer support section) with an untreated one, the conventional plating apparatus has been widely and suitably used in various industrial processes, such as a small lot production or an automatic plating treatment.

However, in the conventional cup-type plating apparatus described in the above, since there is a small height difference between the plating-solution-outlet passages (provided under the wafer support section) on one hand and the surface to be plated of a wafer (mounted on the wafer support section) on the other, an undesired corner area is formed therebetween. As a result, a flow retardation of the plating solution will occur in the corner area, thus causing an ununiform plating on an annular edge portion of the wafer surface to be plated. Consequently, a semiconductor wafer treated in this way is greatly limited in its effectively usable area, resulting in an unsatisfactory yield in industrial production. In order to solve this problem, there has been a demand to develop an improved technique capable of effectively performing a uniform plating treatment on a wafer, so as to produce a plated wafer having an increased effectively usable area.

Further, with the development of a technique called fine wiring in recent years, a circuit to be formed on the surface of a wafer can be processed into an extremely fine pattern. Accordingly, there has been a demand to develop a technique capable of performing a uniform plating treatment on the surface of a wafer on which a fine wiring pattern has been formed.

However, in using the above described conventional cup-type plating apparatus, since the flowing state of the plating solution on the surface to be plated of a wafer is so formed that the plating solution will spread radially and constantly from an area near the center of the surface to be plated to the annular edge portion thereof, it is difficult to effect a uniform plating treatment on the entire surface to be plated having a fine wiring pattern formed thereon. Further, since it has been difficult to cover the entire wafer surface to be plated including its annular edge portion with plating solution, it has been also difficult to ensure a uniform plating treatment on a large area of a wafer.

SUMMARY OF THE INVENTION

In view of the above, this invention provides an improved cup-type plating apparatus capable of solving the problem of ununiform plating on the annular edge portion of a surface to be plated (the surface to be plated) of a wafer, which ununiform plating is usually caused due to an ununiform flow of a plating solution (when using a conventional cup-type plating apparatus), thereby ensuring a uniform plating treatment on the entire surface to be plated of the wafer.

In order to achieve the above object, the present invention provides a cup-type plating apparatus comprising a wafer support section provided along an upper opening of a plating tank, a plurality of solution-outlet passages provided below the wafer support section and extending from the inside of the plating tank to the outside thereof, and at least one solution-supply pipe provided through the bottom of the plating tank. In detail, a plating solution supplied through the at least one solution-supply pipe by virtue of an upward flow of the plating solution, is caused to form a plurality of outward flows passing through the solution-outlet passages and thus arriving at the outside of the plating tank, while at the same time the plating solution is rendered to contact a surface to be plated (the surface to be plated) of a wafer mounted on the wafer support section, to whereby carry out a plating treatment on the wafer. In particular, the plating apparatus of the present invention is characterized in that: below the surface to be plated of the wafer mounted on the wafer support section, there is provided a stirring device for effecting a forced agitation of the plating solution supplied into the plating tank.

In the conventional cup-type plating apparatus described in the above, since the plating solution supplied into the plating tank by virtue of its upward flow is caused to spread radially and constantly from an area near the center of the surface to be plated to the annular edge portion thereof, the concentration of metallic ions of the plating solution near the annular edge portion of the surface to be plated is likely to be different from that near the center of the same surface to be plated. Particularly, when an electric current density is increased, the nature of the plating treatment near the center of the surface to be plated will be different from that near the annular edge portion of the same surface to be plated, resulting in an ununiform plating treatment. In contrast, with the use of the cup-type plating apparatus of the present invention, an upward flow of the plating solution supplied through the at least one plating-solution-supply pipe will be changed in its flowing direction by virtue of the stirring device. Consequently, if viewed on the entire surface to be plated, the plating solution will be in a relatively random flowing state so as to get full contact with the surface to be plated of a wafer. Therefore, the metallic ions of the plating solution are allowed to be uniformly supplied to the entire surface to be plated of a wafer, thus effecting a plating treatment having an extremely high uniformity. Further, since the plating solution is in a relatively random flowing state when getting in contact with the surface to be plated, it is possible to avoid the occurrence of an ununiformly plated external appearance which would otherwise be caused due to an ununiform spreading of the plating solution.

Here, the stirring device of the present invention should not be limited to any specific type, provided that it can effect an agitation of the plating solution supplied to the plating tank by virtue of its upward flow. For example, a stirring blade having a plurality of impellers may be disposed below the surface to be plated of a wafer and can be rotated in this position. Alternatively, a pump device may be added to spray the plating solution so as to change the flowing state of the plating solution being supplied through the plating-solution-supply pipe. This means that any type of stirring device can be used to effect a desired agitation, provided that it can change the flowing state of the plating solution on the surface to be plated (such a flowing state is formed due to an upward flow of the plating solution being supplied hereto).

Specifically, in the cup-type plating apparatus formed according to the present invention, it is preferable that the stirring device comprises a doughnut-like disc having a plurality of stirring impellers capable of effecting a forced change of the flowing state of the plating solution flowing below and in the vicinity of the annular edge portion of the surface to be plated of the wafer, and a driving mechanism capable of supporting the doughnut-like disc in a manner such that the disc can be kept parallel to the surface to be plated of the wafer, and at the same time rotating the disc in a direction perpendicular to the upward flow of the plating solution being supplied through the at least one plating-solution-supply pipe.

In this way, the plating solution supplied to the plating tank by virtue of its upward flow is allowed to pass through the center opening of the doughnut-like disc so as to arrive at the surface to be plated of a wafer. Then, the flowing state of the plating solution spreading radially towards the annular edge portion of the surface to be plated of a wafer will be changed by the stirring blade. Therefore, it is possible to eliminate the flow retardation of the plating solution which would otherwise be caused due to a slight height difference between the plating-solution-outlet passages (provided below the wafer support section) on one hand and the surface to be plated of the wafer (mounted on the wafer support section) on the other, thereby making it possible to perform a uniform plating treatment on the entire surface to be plated including its annular edge portion.

The stirring blade may be of any type if it has a shape capable of effecting a forced change of the flowing state of the plating solution near and below the annular edge portion of the surface to be plated. Further, in order to more effectively change the flowing state of the plating solution on the surface to be plated of a wafer, it is more preferable that a stirring blade be located in the vicinity of the surface to be plated. Moreover, the shape and the area of the center opening of the doughnut-like disc may be made to be coincident with the position and the size of the plating-solution-supply pipe, provided that the plating solution supplied to the plating tank by virtue of its upward flow can arrive at the surface to be plated of a wafer mounted on the wafer support section.

PREFERRED EMBODIMENT

Figure 1:
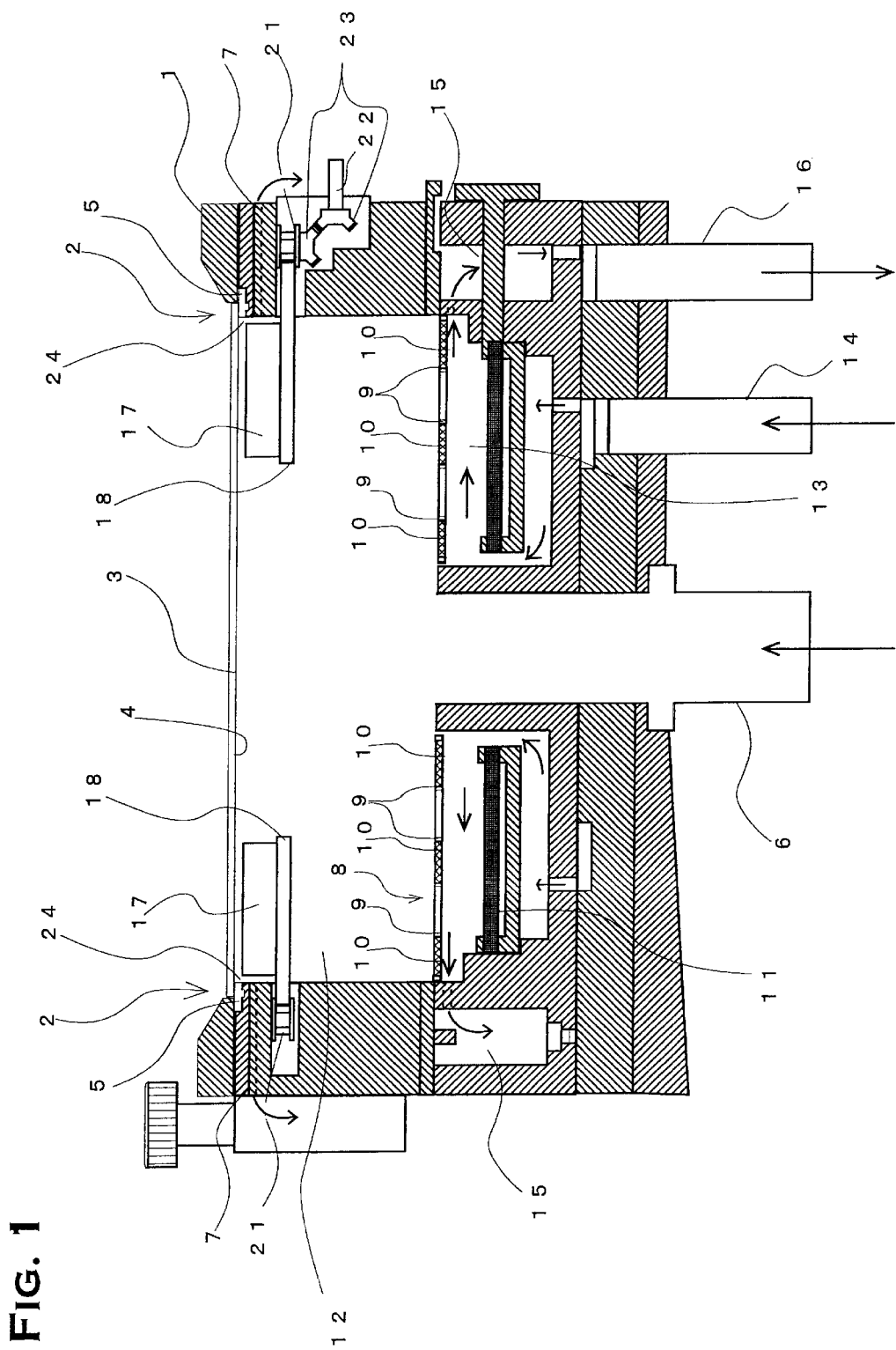
FIG. 1 is a sectional view showing a plating tank of a cup-type plating apparatus formed according to an embodiment of the present invention.

In the following, description will be given to explain in detail a preferred embodiment of a cup-type plating apparatus formed according to the present invention. FIG. 1 is a sectional view schematically showing the cup-type plating apparatus of the present embodiment. As shown in FIG. 1, the cup-type plating apparatus of this embodiment comprises a wafer support section 2 provided along an upper opening of a plating tank 1. A wafer 3 is mounted on the wafer support section 2. In this way, a plating treatment is performed on a surface 4 to be plated of the wafer 3. The wafer support section 2 comprises a not-shown cathode and a seal packing 5 provided beneath the cathode for preventing a possible leakage of the plating solution.

Further, on the central bottom of the plating tank 1 there is provided a main-plating-solution supply pipe 6. Below the wafer support section 2 there are provided a plurality of solution-outlet passages 7 which are used to cause the plating solution arriving at the vicinity of the surface 4 to be plated of the wafer 3 to flow outwardly towards the outer circumference of the wafer 3 so as to lead the plating solution to the outside of the plating tank 1.

Further, a partition 8 is provided within the plating tank 1. The partition 8 has a disc-like shape which is coincident in size and shape with the cross section of the plating tank 1, and is fixed within the plating tank 1 in a manner such that the partition 8 is inserted and fixed over the main-plating-solution supply pipe 6. A plurality of openings 9, 9, 9 ... are formed through the partition 8. Each opening 9 has a diaphragm 10 so that the openings 9, 9, 9 are all covered up by the diaphragms. Here, the plurality of openings 9 are arranged at an equal interval from one another, concentrically around the main-plating-solution supply pipe 6. Specifically, the diaphragm 10 is a porous film formed by an insulation material and thus has a desired chemical resistance so that the diaphragm 10 will not be corroded by the plating solution. Therefore, the diaphragm 10 allows an electric conduction between an anode and the wafer 3 through numerous ions contained in the plating solution.

Below the partition 8 there is provided an anode 11 having a disc-like shape, disposed surrounding the main-plating-solution supply pipe 6. In fact, the internal space of the plating tank 1 is divided by the partition 8 into two sections, with one section serving as a wafer side isolation chamber 12 located on the upper, and the other section serving as an anode-side isolation chamber 13 located on the lower. The anode-side isolation chamber 13 is connected with an auxiliary-plating-solution supply pipe 14 which is different from the main-plating-solution supply pipe 6 and extends through the bottom of the plating tank 1 to supply an auxiliary plating solution. Furthermore, on the outside of the anode-side isolation chamber 13, there is formed an annular auxiliary-plating-solution storage chamber 15 which is used to discharge the auxiliary plating solution flowed into the anode-side isolation chamber 13. In addition, the auxiliary-plating-solution storage chamber 15 is connected with an auxiliary-plating-solution discharge pipe 16 for discharging the auxiliary plating solution.

Figure 2:
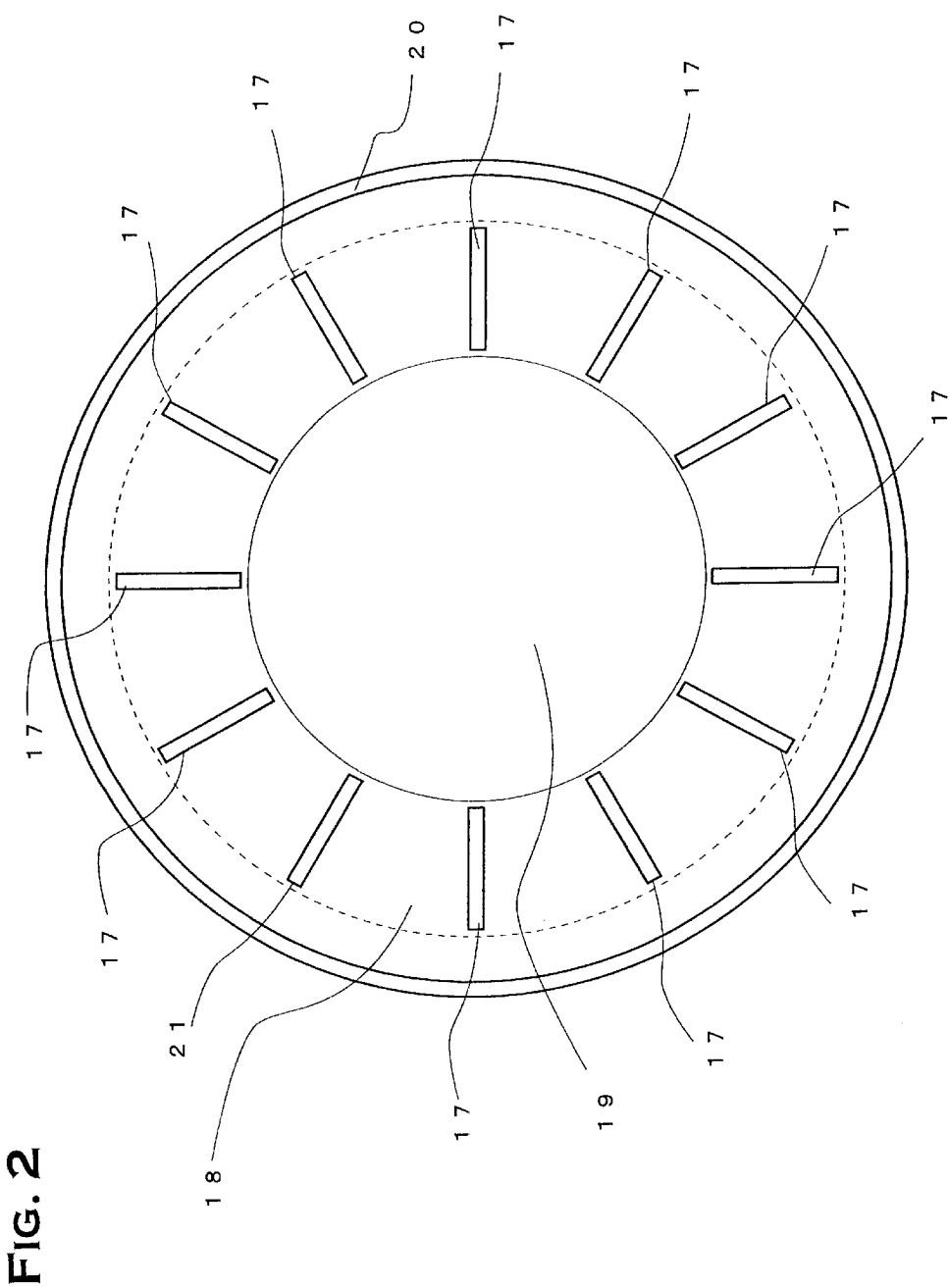
FIG. 2 is a plain view showing a doughnut-like disc.

Within the wafer side isolation chamber 12 there is disposed a doughnut-like disc 18 on which a plurality of impellers 17 are formed upright towards the surface 4 to be plated of the wafer 3. Here, the plurality of impellers 17 are disposed in positions such that the upper ends thereof are close to the surface 4 to be plated. The doughnut-like disc 18, when viewed as a plane view, presents an arrangement as shown in FIG. 2. As shown in the figure, the disc 18 is formed with a center opening 19. The plurality of the impellers 17 are arranged radially on the disc 18. Further, on the outside of the doughnut-like disc 18 there is formed an annular gear portion 20. In particular, the doughnut-like disc 18 is supported in position by engaging its gear portion 20 with a plurality of pulleys 21, in a manner such that the plate 18 is positioned under the main-plating-solution outlet passages 7 and is parallel with the surface 4 to be plated of the wafer. In fact, one of the pulleys 21 is engaged with a bevel gear 23 which is in turn operatively connected with a driving shaft 22.

The plating solution supplied upwardly through the main-plating-solution supply pipe 6 by virtue of an upward flow, will flow through the central opening 19 of the doughnut-like disc 18 so as to arrive at the surface 4 to be plated, thereby forming a flowing state of the plating solution spreading radially towards the outer side of the surface 4 to be plated. At this time, the pulleys 21 are rotated by the driving shaft 22 through the bevel gear 23, so that the doughnut-like disc 18 is caused to turn in a plane perpendicular to the upward flow of the plating solution. Then, by virtue of the impellers 17 formed on the doughnut-like disc 18, there will be a change in the flowing state of the plating solution spreading radially towards the outer side of the surface 4 to be plated. In particular, an annular corner area 24 is formed between the main-plating-solution outlet passages 7 and the surface 4 to be plated. As a result, the plating solution flow is likely to retard in the annular corner area 24. However, by virtue of the stirring action of the impellers 17, the plating solution is allowed to flow smoothly and sufficiently over the annular corner area 24.

When the plating treatment was performed on a wafer using the cup-type plating apparatus shown in-the present embodiment, it was found that there was no difference between the nature of plating in the vicinity of the center of the surface to be plated and that in its annular edge portion, thereby proving that the finished plating treatment is uniform. Moreover, it was found that the outside appearance of each plated wafer did not have an ununiform liquid flow trace (which ununiform liquid flow trace is likely to occur if the plating solution is in the form of a constant flowing state).

Therefore, with the use of the cup-type plating apparatus of the present invention, an entire surface to be plated cabn be plated uniformly, thereby making it possible to avoid an ununiform plating which is otherwise likely to occur in the annular edge portion of the surface to be plated.

What is claimed is:

1. cup-shaped plating apparatus comprising:
   plating tank having an inside, an outside, and a bottom;
   a wafer support section provided along an upper opening of the plating tank;
   a plurality of remotely situated solution-outlet passages provided below the wafer support section and extending from the inside to the outside of the plating tank; and a stirring device directly adjacent to a solution-outlet passage; and
   at least one solution-supply pipe provided through the bottom of the plating tank which permits the supply of a plating solution through the at least one solution-supply pipe, to form a plurality of outward flows passing through the solution-outlet passages to reach the outside of the plating tank; and during passage inside the plating tank, contacting a surface of a wafer mounted on the wafer support section to thereby carry out a plating treatment on the wafer, and
   the stirring device in the cup-shaped plating apparatus is disc shaped and has an opening in the center thereof for effecting a forced agitation below the surface of the plating solution.

2. A cup-shaped plating apparatus according to claim 1, wherein the stirring device comprises:
   a disc shaped device having an opening in the center thereof and having a plurality of stirring impellers capable of forcibly changing the flowing state of the plating solution flowing below and in the vicinity of the annular edge portion of the surface to be plated of the wafer; and
   a driving mechanism capable of supporting the disc shaped device such that the disc shaped device can be maintained parallel to the surface to be plated of the wafer, while rotating the disc shaped device in a direction perpendicular to the upward flow of the plating solution supplied through the solution-supply pipe.

3. A cup-shaped plating apparatus comprising:
   a plating tank having an inside, an outside, and a bottom;
   a wafer support section provided along an upper opening of the plating tank;
   a plurality of remotely situated solution-outlet passages provided below the wafer support section and extending from the inside to the outside of the plating tank; and
   at least one solution-supply pipe provided through the bottom of the plating tank which permits the supply of a plating solution through the at least one solution-supply pipe, to form a plurality of outward flows passing through the solution-outlet passages to reach the outside of the plating tank; and, during passage inside the plating tank, contacting a surface of a wafer mounted on the wafer support section to thereby carry out a plating treatment on the wafer, and
   a stirring device in the cup-shaped plating apparatus for effecting a forced agitation below the surface of the plating solution supplied through the solution-supply pipe, wherein said stirring device comprises a disc shaped device having an opening in the center thereof having a plurality of stirring impellers capable of forcibly changing the flowing state of the plating solution flowing below and in the vicinity of the annular edge portion of the surface to be plated of the water; and wherein the stirring device further comprises a driving mechanism capable of supporting the disc shaped device in a manner such that the disc shaped device can be maintained parallel to the surface to be plated of the water, while rotating the disc shaped device in a direction perpendicular to the upward flow of the plating solution supplied through the solution-supply pipe.

4. A cup-shaped plating apparatus comprising:
   a plating tank having an inside, an outside, sides and a bottom;
   a wafer support section provided along an upper opening of the plating tank;
   a plurality of solution-outlet passages provided below the wafer support section and extending from the inside to the outside of the plating tank, wherein the plurality of remotely situated solution-outlet passages are located through at least one side of the plating tank;

at least one solution-supply pipe provided through the bottom of the plating tank which permits the supply of a plating solution through the at least one solution-supply pipe, to form a plurality of outward flows passing through the solution-outlet passages to reach the outside of the plating tank and, during passage inside the plating tank, contacting a surface of a wafer mounted on the wafer support section to thereby carry out a plating treatment on the wafer, and a disc shaped stirring device having an opening in the center thereof in the cup-shaped plating apparatus for effecting a forced agitation below the surface of the plating solution.

* * * * *